(12) United States Patent
Shi et al.

(10) Patent No.: US 7,812,670 B2
(45) Date of Patent: Oct. 12, 2010

(54) BASEBAND PREDISTORTION DEVICE AND METHOD

(75) Inventors: Zhan Shi, Beijing (CN); Hui Li, Beijing (CN); Jianmin Zhou, Beijing (CN); Gang Sun, Beijing (CN)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/494,095

(22) Filed: Jun. 29, 2009

(65) Prior Publication Data
US 2010/0001795 A1   Jan. 7, 2010

(30) Foreign Application Priority Data
Jun. 30, 2008   (CN) .................. 2008 1 0127248

(51) Int. Cl.
*H03F 1/26* (2006.01)

(52) U.S. Cl. .................. 330/149; 330/107; 330/278

(58) Field of Classification Search .................. 330/149, 330/107, 278
See application file for complete search history.

(56) References Cited

U.S. PATENT DOCUMENTS

| | | | |
|---|---|---|---|
| 6,266,517 B1 * | 7/2001 | Fitzpatrick et al. | 455/114.3 |
| 6,882,217 B1 * | 4/2005 | Mueller | 330/2 |
| 6,985,033 B1 * | 1/2006 | Shirali et al. | 330/149 |
| 7,068,984 B2 * | 6/2006 | Mathe et al. | 455/126 |
| 7,362,818 B1 * | 4/2008 | Smith et al. | 375/296 |
| 7,741,906 B1 * | 6/2010 | Summerfield | 330/149 |

* cited by examiner

*Primary Examiner*—Patricia Nguyen
(74) *Attorney, Agent, or Firm*—Hanify & King, P.C.

(57) ABSTRACT

The present invention discloses a baseband predistorter and baseband predistortion method. The baseband predistorter comprising: an address generator for calculating an address of a phase basic lookup table and an address of an amplitude basic lookup table; a parameter determining unit for determining a phase translational amount, an amplitude translational amount, a phase curvature adjustment amount and an amplitude curvature adjustment amount; a phase translating unit for changing the address in accordance with the phase translational amount; an amplitude translating unit for changing the address in accordance with the amplitude translational amount; a phase basic lookup table searching section for determining a corresponding phase output; an amplitude basic lookup table searching section, for determining a corresponding amplitude output; a phase curvature adjusting section, for adjusting the phase output; and an amplitude curvature adjusting section, for adjusting the amplitude output.

10 Claims, 10 Drawing Sheets

BASEBAND PREDISTORTION DEVICE AND METHOD

TECHNICAL FIELD

The present invention relates to a predistortion linearization technique of nonlinear device, and more particularly, to linearization of power amplifier.

BACKGROUND ART

Power amplifier (PA) is an important part of an electronic apparatus. It can amplify the power of a weak electric signal to meet the requirement of transmission and emission. Wherein the energy for amplification is supplied by a DC power source, i.e., the PA converts DC energy into a AC signal, so that the power of the AC signal meets the requirement. Here the capability of the PA that converts DC energy into AC energy is called as an efficiency of the PA. The relationships between powers of input and output signals of the PA can be divided into a linear region, a nonlinear region, and a saturation region.

When an envelope of the input signal only fluctuates in the linear region, the input signal is amplified ideally. Whereas when the envelope of the input signal fluctuates to the nonlinear region, the output signal will be distorted. In time domain, the distortion appears as the output signal being not amplified ideally; and in frequency domain, the distortion appears as the side lobe of the output signal spectrum increasing and the main lobe distorted, which is not hoped.

Due to physical reasons, when the envelope of the input signal fluctuates deep to the nonlinear region, the efficiency of the PA will be much higher than that when the envelope only fluctuates in the linear region. With the appearance of new modulation methods, the dynamic range of the signal envelope becomes wider, the nonlinear distortion is inevitable, and the key is how to overcome the nonlinearity.

Baseband predistortion technique is an effective means for overcoming the PA nonlinearity. It predistorts the baseband digital signal by simulating the inverse characteristics of the PA nonlinearity, so as to obtain an ideal amplified signal at the PA output end.

Basic inverse characteristics of PA can be obtained through measurement, and are integrated into a predistortion module of PA as predistortion data. But influenced by factors such as temperature, humidity, device aging, etc., the PA inverse characteristics will be changed. In order to adjust predistortion data in real time, the classic method (vector method) requires accurately comparing PA input data and feedback output data during the operation of the PA, and this concerns problems such as accurate synchronization, IQ balance, etc. In order to solve those problems, a large cost is usually paid in the circuit.

Subsequent researchers suggest only using feedback scalar quantity information as the basis for selecting or updating predistortion data. Common scalar quantity information includes spectrum side lobe power, power ratio between the main and side lobes, etc., which can be used without an accurate synchronization, and the problem of IQ imbalance does not exist. The key is the setting of predistortion data, and this method is called as scalar method.

The conventional scalar methods for setting predistortion data can be substantially divided into two types: selection type and update type.

Selection type: storing much predistortion data or characteristic data (e.g., multinomial coefficient, interpolation key point, etc.), and selecting proper predistortion data or characteristic data according to the scalar quantity information.

Update type: adaptively updating the values of multinomial coefficient and interpolation key point according to the scalar quantity information.

Figure 1:
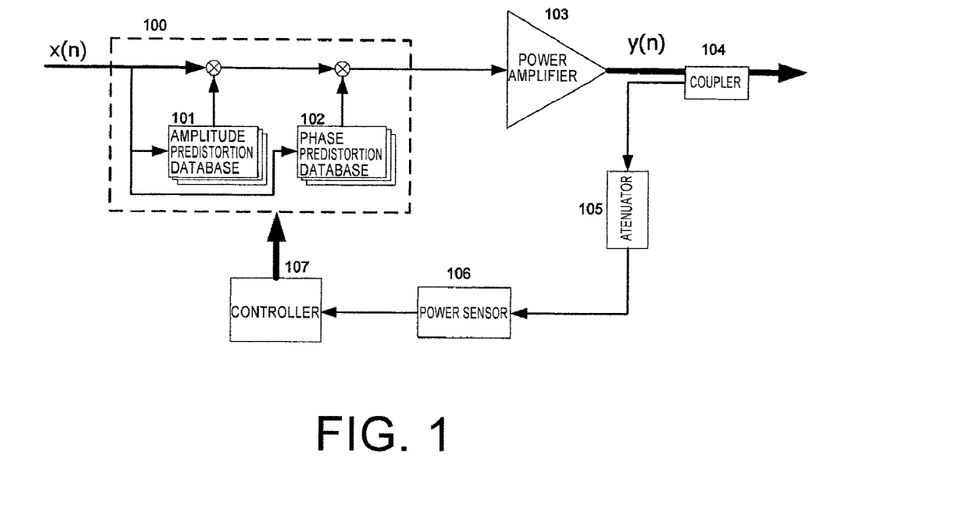
FIG. 1 is a diagram shows the principle of scalar predistortion.
Figure 2:
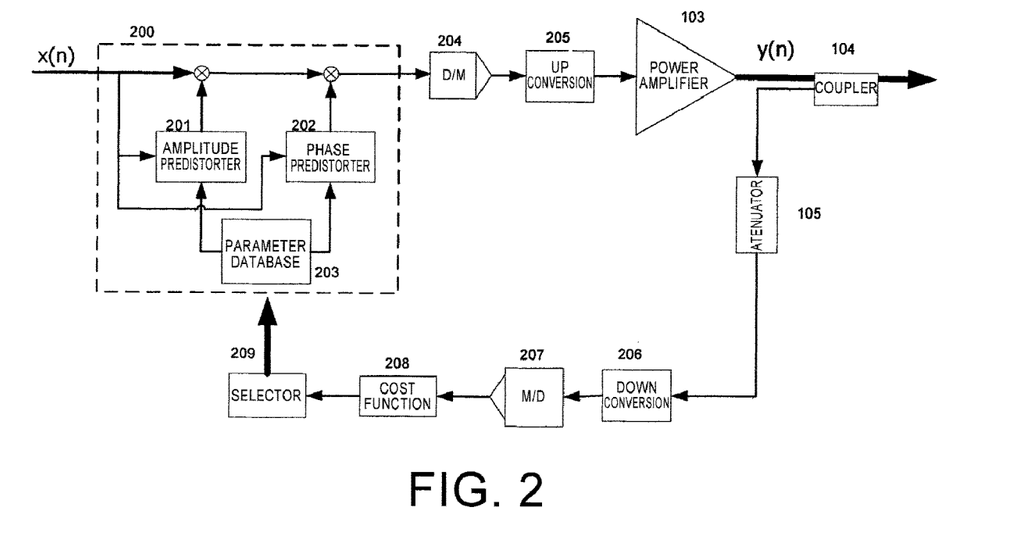
FIG. 2 schematically shows a conventional selection type scalar method baseband digital predistortion method.
Figure 3:
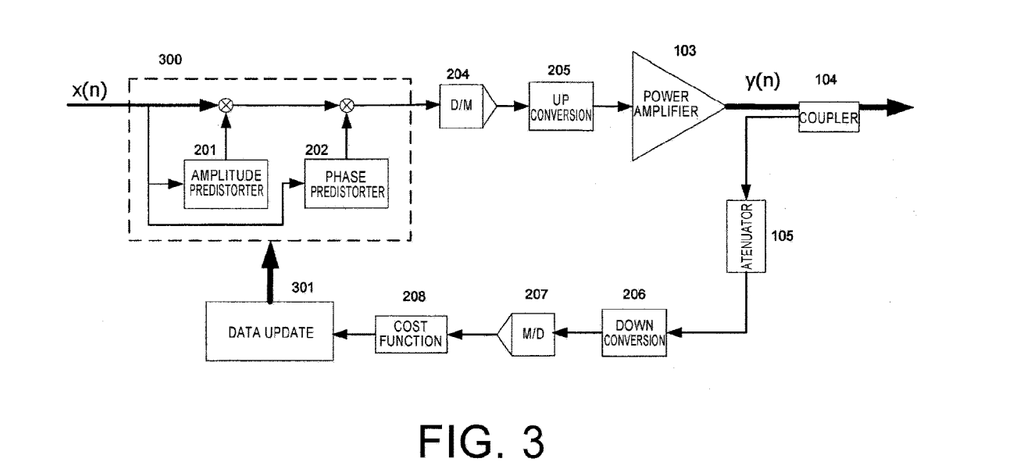
FIG. 3 schematically shows a conventional update type scalar method baseband digital predistortion method.

FIGS. 1-3 are schematic diagrams of the scalar method principle and the conventional scalar methods.

FIG. 1 schematically shows the principle of scalar method baseband digital predistortion method. The basic concept is to pre-store several groups of predistortion data in an amplitude predistortion database unit 101 and a phase predistortion database unit 102, and select one group of predistortion data, based on the distortion amount (e.g., side lobe power) in a feedback signal, to perform a predistortion operation.

In details, the initial signal x(n) is divided into two branches, one branch is respectively sent to the amplitude predistortion database unit 101 and the phase predistortion database unit 102 in a predistortion unit 100 (predistorter); the other branch is multiplied by output data from the amplitude predistortion database unit 101 and the phase predistortion database unit 102, so as to obtain a predistortion signal. The signal is sent to a power amplifier 103 which outputs a signal y(n). One part of the signal y(n) is fed back by a coupler 104 and weakened by an attenuator 105. After that, a power detector 106 detects an out-band power or a ratio between out-band power and in-band power of the signal weakened by the attenuator 105. A controller 107 outputs a control amount based on the detection result of the power detector 106. According to the control amount outputted by the controller 107 and the initial input signal x(n), the amplitude predistortion database unit 101 and the phase predistortion database unit 102 select one group of predistortion data from the database to perform a predistortion operation.

FIG. 2 schematically shows a selection type scalar method baseband digital predistortion method. A great deal of characteristic parameters (e.g., multinomial coefficient, interpolation key point, etc.) of predistortion data are stored in a predistortion parameter database 203, then an amplitude predistorter 201 and a phase predistorter 202 generate predistortion data based on characteristic data interpolation (or using other calculation methods).

In details, the initial signal x(n) is divided into two branches, one branches is respectively sent to the amplitude predistorter 201 and the phase predistorter 202; the other branch is multiplied by output data from the amplitude predistorter 201 and the phase predistorter 202, so as to obtain a predistortion signal. The signal is converted by a digital-to-analog converter 204 and then an up converter 205, and sent to the power amplifier 103 which outputs a signal y(n). One part of the signal y(n) is fed back by the coupler 104 and weakened by the attenuator 105, then converted into a baseband digital signal by a down converter 206 and an analog-to-digital converter 207. The signal is converted into a cost function by a cost function calculator 208, and the cost function is sent to a selector 209. The selector 209 selects proper characteristic parameters of predistortion data from the predistortion parameter database 203 according to the value of the cost function, and sends them to the amplitude predistorter 201 and the phase predistorter 202. The amplitude predistorter 201 and the phase predistorter 202 calculate and generate predistortion data, based on the parameters and the initial input signal. In FIG. 2, the amplitude predistorter 201, the phase predistorter 202 and the predistortion parameter database 203 constitute a predistortion unit (predistorter).

This method requires prestoring the predistortion parameter, thus also needs a large storage capacity.

FIG. 3 schematically shows a conventional update type scalar method baseband digital predistortion method. As shown in FIG. 3, the method updates and calculates, on the spot, characteristic parameters according to scalar quantity information (data updating module 301). The contents of FIG. 3 are mostly same as FIG. 2, except that the cost function value is sent to the data updating module 301, which updates and calculates the parameters according to the cost function value on the spot, and sends the parameters to the amplitude predistorter 201 and the phase predistorter 202 of the predistortion unit 300.

Generally, generating predistortion data based on characteristics needs complex calculations, and this method also has the defect of requiring a large amount of calculations.

SUMMARY OF THE INVENTION

In view of the above conditions, the present invention is provided to overcome one or more shortages of the prior art, and give at least one beneficial choice. The present application provides a method and device for generating predistortion data, through which abundant and delicate predistortion data can be generated with small storage space and calculation amount.

In order to achieve the above object, the application provides the following aspects.

Aspect 1

A baseband predistorter, comprising:
an address generator for calculating, in accordance with an input signal, an address of a phase basic lookup table and an address of an amplitude basic lookup table;
a parameter determining unit for determining, in accordance with scalar quantity information of a feedback signal, a phase translational amount (j), an amplitude translational amount (i), a phase curvature adjustment amount (v) and an amplitude curvature adjustment amount (u);
a phase translating unit, for changing the address calculated by the address generator, in accordance with the phase translational amount (j) determined by the parameter determining unit;
an amplitude translating unit, for changing the address calculated by the address generator, in accordance with the amplitude translational amount (i) determined by the parameter determining unit;
a phase basic lookup table searching section, for searching the phase basic lookup table in accordance with the address changed by the phase translating unit to determine a corresponding phase output of the phase basic lookup table;
an amplitude basic lookup table searching section, for searching the amplitude basic lookup table in accordance with the address changed by the amplitude translating unit to determine a corresponding amplitude output of the amplitude basic lookup table;
a phase curvature adjusting section, for adjusting the phase output determined by the phase basic lookup table searching section, in accordance with the phase curvature adjustment amount (v) determined by the parameter determining unit; and
an amplitude curvature adjusting section, for adjusting the amplitude output determined by the amplitude basic lookup table searching section, in accordance with the amplitude curvature adjustment amount (u) determined by the parameter determining unit.

Aspect 2

The baseband predistorter according to aspect 1, wherein the parameter determining unit comprises a parameter selection controlling unit for selecting, in accordance with the scalar quantity information of the feedback signal, suitable phase translational amount (j), amplitude translational amount (i), phase curvature adjustment amount (v) and amplitude curvature adjustment amount (u) from corresponding databases.

Aspect 3

The baseband predistorter according to aspect 1, wherein the parameter determining unit comprises a parameter calculating unit for calculating, in accordance with the scalar quantity information of the feedback signal suitable phase translational amount (j), amplitude translational amount (i), phase curvature adjustment amount (v) and amplitude curvature adjustment amount (u).

Aspect 4

The baseband predistorter according to aspect 1, wherein the phase translating unit and the amplitude translating unit are adders for respectively adding the phase translational amount (j) and the amplitude translational amount (i) determined by the parameter determining unit to the address calculated by the address generator.

Aspect 5

The baseband predistorter according to aspect 1, wherein the phase curvature adjusting section and the amplitude curvature adjusting section each comprises a first parameter calculating unit, a second parameter calculating unit, a multiplier and an adder,
the first parameter calculating unit calculates a first parameter (1+u or 1+v);
the second parameter calculating unit calculates a second parameter (-uLUT(0) or -vLUT(0));
the multiplier multiplies the output of the amplitude basic lookup table searching section or the output of the phase basic lookup table searching section with the first parameter; and
the adder adds the multiplication result of the multiplier to the second parameter.

Aspect 6

The baseband predistorter according to aspect 1, further comprising a longitudinal direction translating unit; wherein the parameter determining unit determines a longitudinal direction translational amount (m) in accordance with the scalar quantity information of the feedback signal, and the longitudinal direction translating unit performs longitudinal direction translation, in accordance with the longitudinal direction translational amount (m) determined by the parameter determining unit, on the outputs of the phase curvature adjusting section and the amplitude curvature adjusting section, or on the signals translated by the amplitude translating unit and the phase translating unit.

Aspect 7

The baseband predistorter according to aspect 1, wherein when the changed address exceeds a valid address range, the phase translating unit and the amplitude translating unit set the changed address as a valid address closest to the changed address.

Aspect 8

An amplifier apparatus, comprising:
the baseband predistorter according to any one of aspects 1-7;
a multiplier, for multiplying a predistortion signal outputted by the baseband predistorter with an input signal;
a digital-to-analog converter, for converting a digital signal outputted by the multiplier into an analog signal;
an up converter, for performing up conversion on the output of the digital-to-analog converter;
an amplifying unit, for amplifying an output signal of the up converter; and a feedback branch, for feeding back a portion of the output of the amplifying unit, i.e. a feedback signal, and for obtaining scalar quantity information of the feedback signal.

Aspect 9

The amplifier apparatus according to aspect 8, wherein the feedback branch comprises:

a filter, for filtering the feedback signal to obtain a distorted portion of the feedback signal; and a cost function obtaining section, for determining the scalar quantity information of the feedback signal in accordance with the distorted portion obtained by the filter.

Aspect 10

The amplifier apparatus according to aspect 8, wherein the feedback branch comprises:

a down converter, for performing down conversion on the feedback signal;

an analog-to-digital converting unit, for performing an analog-to-digital conversion on the signal having been performed with the down conversion by the down converter;

a frequency domain information obtaining unit, for obtaining frequency domain information of the signal having been analog-to-digital converted; and a cost function obtaining section, for determining the scalar quantity information of the feedback signal in accordance with the obtained frequency domain information.

Aspect 11

A baseband predistortion method, comprising:

calculating, in accordance with an inputted signal, an address of a basic amplitude lookup table and an address of a basic phase lookup table;

determining, in accordance with scalar quantity information of a feedback signal, a phase translational amount (j), an amplitude translational amount (i), a phase curvature adjustment amount (v) and an amplitude curvature adjustment amount (u);

changing the calculated address of the basic phase lookup table, in accordance with the phase translational amount (j);

changing the calculated address of the basic amplitude lookup table, in accordance with the amplitude translational amount (i);

searching the phase basic lookup table in accordance with the address changed in accordance with the phase translational amount (j) to determine a corresponding phase output of the phase basic lookup table;

searching the amplitude basic lookup table in accordance with the address changed in accordance with the amplitude translational amount (i) to determine a corresponding amplitude output of the amplitude basic lookup table;

adjusting the phase output in accordance with the phase curvature adjustment amount (v); and adjusting the amplitude output in accordance with the amplitude curvature adjustment amount (u).

Aspect 12

A machine-readable computer program executed to enable the machine to perform the baseband predistortion method that comprises:

calculating, in accordance with an inputted signal, an address of a basic amplitude lookup table and an address of a basic phase lookup table;

determining, in accordance with scalar quantity information of a feedback signal, a phase translational amount (j), an amplitude translational amount (i), a phase curvature adjustment amount (v) and an amplitude curvature adjustment amount (u);

changing the calculated address of the basic phase lookup table, in accordance with the phase translational amount (j);

changing the calculated address of the basic amplitude lookup table, in accordance with the amplitude translational amount (i);

searching the phase basic lookup table in accordance with the address changed in accordance with the phase translational amount (j) to determine a corresponding phase output of the phase basic lookup table;

searching the amplitude basic lookup table in accordance with the address changed in accordance with the amplitude translational amount (i) to determine a corresponding amplitude output of the amplitude basic lookup table;

adjusting the phase output in accordance with the phase curvature adjustment amount (v); and adjusting the amplitude output in accordance with the amplitude curvature adjustment amount (u).

Aspect 13

A machine-readable storage medium that stores the computer program of aspect 12.

BRIEF DESCRIPTION OF THE DRAWINGS

The drawings illustrate the preferred embodiments of the invention, and constitute a part of the Description. The drawings are used together with the text to further explain the invention principle, wherein.

DETAILED DESCRIPTION OF THE PREFERRED EMBODIMENTS

The embodiments of the scalar baseband predistortion device and method of the present invention are detailedly described as follows in conjunction with the drawings.

The principle of the present invention is explained firstly before the embodiments are described.

The basic characteristics (AM-AM, PM-PM) of a power amplifier can be obtained in advance via measurement. A basic predistortion lookup table (LUT) can be obtained based on the above basic characteristics, including a basic amplitude compensation LUT (amplitude basic lookup table) and a basic phase compensation LUT (phase basic lookup table). There are many common methods of constructing a basic predistortion LUT based on the basic characteristics of the power amplifier, and herein are not described anymore.

Basic amplitude compensation LUT:

$$A_0^0 = [\alpha_0, \alpha_1, \ldots, \alpha_{K-1}] \quad (1)$$

Basic phase compensation LUT:

$$P_0^0 = [\beta_0, \beta_1, \ldots, \beta_{K-1}] \quad (2)$$

Wherein K is a length of LUT. $\alpha_k$ and $\beta_k$ respectively represent the k-th elements (k=0, ... K−1) in the basic amplitude compensation LUT and the basic phase compensation LUT. Here $A_0^0$ and $B_0^0$ adopt superscripts and subscripts, wherein the subscripts are parameters of "translating operation" (to be explained in the following text), and the superscripts are parameters of "bending operation" (to be explained in the following text).

Many other LUTs can be derived from the basic predistortion LUT via the translating operation and/or bending operation.

Translating operation:

The derived amplitude compensation LUT by translating:

$$A_i^0(k) = A_0^0(k+i) \quad (3)$$

The derived phase compensation LUT by translating:

$$P_j^0(k) = P_0^0(k+j) \quad (4)$$

Here i and j are parameters of the translating operation, and k represents the k-th element.

Bending Operation:

The derived amplitude compensation LUT by bending:

$$A_0^u(k) = u(A_0^0(k) - A_0^0(0)) + A_0^0(k) \quad (5)$$
$$= (1+u)A_0^0(k) - uA_0^0(0)$$

The derived phase compensation LUT by bending:

$$P_0^v(k) = v(P_0^0(k) - P_0^0(0)) + P_0^0(k) \quad (6)$$
$$= (1+v)P_0^0(k) - vP_0^0(0)$$

Here u and v are parameters of the bending operation.

That is to say, various derived LUTs can be obtained by jointly adjusting i, j, u and v.

Thus the object of achieving a predistortion and improving the power amplifier nonlinearity can be realized just by storing the basic LUT, and adjusting and selecting i, j, u and v in accordance with the scalar quantity information of a feedback signal (side lobe power or power ratio between the main and side lobes)

Furthermore, in order to depict the LUT characteristics more concretely, the basic LUT can be segmented, e.g., into two segments:

Basic amplitude compensation LUT:

$$A_0^0 = [A1_0^0 A2_0^0] \quad (7)$$

Front segment:

$$A1_0^0 = [\alpha_0, \alpha_1, \ldots, \alpha_L] \quad (8)$$

Rear segment:

$$A2_0^0 = [\alpha_{L+1}, \alpha_{L+2}, \ldots, \alpha_{K-1}] \quad (9)$$

Basic phase compensation LUT:

$$P_0^0 = [P1_0^0 P2_0^0] \quad (10)$$

Front segment:

$$P1_0^0 = [\beta_0, \beta_1, \ldots, \beta_L] \quad (11)$$

Rear segment:

$$P2_0^0 = [\beta_{L+1}, \beta_{L+2}, \ldots, \beta_{K-1}] \quad (12)$$

Wherein:

$$L = \text{round}(K/2) \quad (13)$$

is the location at which the lookup table is segmented, and round( ) represents round function.

Generally, A1, P1, ... can be replaced by At, Pt (t□1, 2), thus

In accordance with the translating operation:

Translation-derived amplitude compensation LUT:

$$At_{i_t}(k) = At_0^0(k+i_t) \quad (14)$$

Translation-derived phase compensation LUT:

$$Pt_{j_t}^0(k) = Pt_0^0(k+j_t) \quad (15)$$

Here $i_t$ and $j_t$ are translating parameters at the t-th segment.

In accordance with the bending operation:

Bend-derived amplitude compensation LUT:

$$At_0^{u_t}(k) = u_t(At_0^0(k) - At_0^0(0)) + At_0^0(k) \quad (16)$$
$$= (1+u_t)At_0^0(k) - u_t At_0^0(0)$$

Bend-derived phase compensation LUT:

$$Pt_0^{v_t}(k) = v_t(Pt_0^0(k) - Pt_0^0(0)) + Pt_0^0(k) \quad (17)$$
$$= (1+v_t)Pt_0^0(k) - v_t Pt_0^0(0)$$

Here $u_t$ and $v_t$ are bending parameters of the t-th segment. Upon actual request, the basic LUT can be divided into more segments, i.e., t□1, 2, 3 . . . , and uneven segments are also allowed.

In addition, under certain conditions, longitudinal translating operations shall be performed, thus Longitudinal-translation-derived amplitude compensation LUT:

$$A_{0\_m}^0(k) = A_0^0(k) + m \quad (18)$$

Longitudinal-translation-derived phase compensation LUT:

$$P_{0\_n}^0(k) = P_0^0(k) + n \quad (19)$$

Here m and n are parameters for respectively controlling the translation amounts.

The preferred embodiments of the baseband digital predistortion device and method of the present invention according to the above principle are described as follows.

Figure 4:
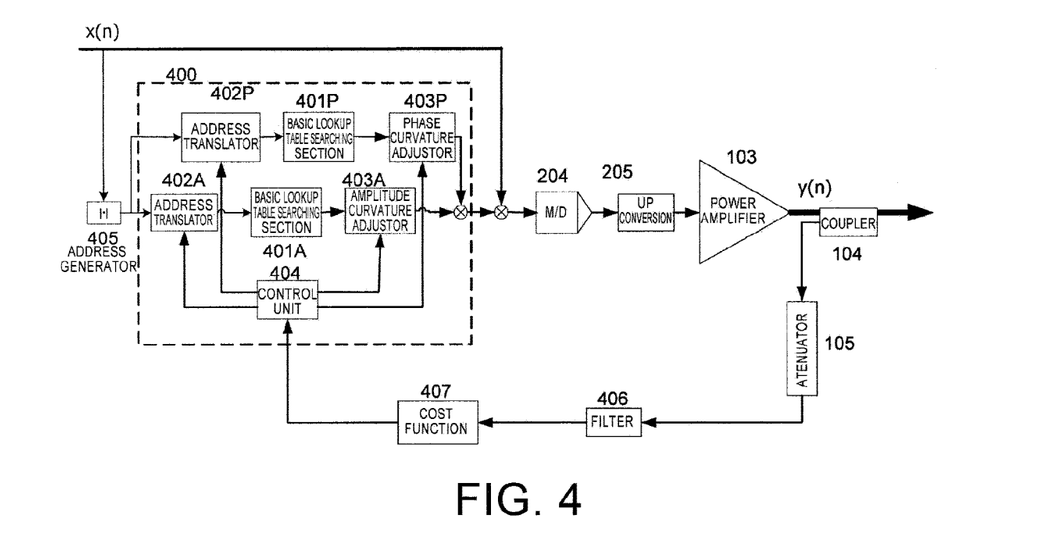
FIG. 4 schematically shows a baseband digital predistortion device according to one embodiment of the present invention.

FIG. 4 schematically shows a baseband digital predistortion device according to one embodiment of the present invention.

The baseband digital predistortion device in FIG. 4 differs from that in FIG. 3 as follows: a predistortion unit 400 in FIG. 4 is different from a predistortion unit 300 in FIG. 3.

As shown in FIG. 4, the predistortion unit 400 of the present invention comprises an address generator 405, an amplitude address translator 402A, a phase address translator 402P, a basic lookup table searching section 401A, a basic lookup table searching section 401P, an amplitude curvature adjuster 403A, a phase curvature adjuster 403P, and a control unit 404 (parameter determining unit).

The initial input signal x(n) is divided into two branches, one branch is inputted to the address generator 405 to generate lookup table address (e.g., the index indicated by the abscissa in FIG. 8), and the other branch is multiplied by the initial predistortion data.

The first branch is converted into a lookup table address by the address generator 405; e.g., the lookup table address can be calculated by calculating the module value of the input signal. The address is sent to the address translators 402A and 402P. Under the control of the controller 404, the address translators 402A and 402P perform a translation correction of the address to obtain new address information.

According to the address information after translation correction, the basic lookup table searching section 401A and the basic lookup table searching section 401P search the stored basic amplitude compensation LUT and basic phase compensation LUT, respectively, and output a predistortion value, respectively. As mentioned previously, the basic amplitude compensation LUT and basic phase compensation LUT can be obtained in advance. The predistortion values outputted by the basic lookup table searching section 401A and basic lookup table searching section 401P are adjusted by the amplitude curvature adjuster 403A and phase curvature adjuster 403P, respectively, to obtain new initial predistortion data, and their product will be multiplied by the other branch of the initial input signal x(n) to obtain a predistortion signal.

The predistortion signal is converted into an analog signal by a digital-to-analog (D/A) converter 204, then converted into a radio frequency by an up converter 205, and next amplified by a power amplifier 103. One part of the amplified signal y(n) is transmitted, the other part is fed back by a coupler 104 and weakened by an attenuator 105, and the side lobe (aberration portion) is filtered by a filter 406. The signal will be transmitted to a cost function generation module 407. The module senses the power of the input signal (i.e., the side lobe), converts it into a digital signal, and transmit to the control unit 404. In the Description, the outputs of the cost function generation module 407 and a cost function generation module 507 to be described later are both called as scalar quantity information of feedback signal.

The control unit 404 determines, based on the signal from the cost function generation module 407, data to be sent to the address translators 402 (including the address translators 402A and the address translator 402P) and the curvature adjusters 403 (including the amplitude curvature adjuster 403A and the phase curvature adjuster 403P). The address translators 402 and the curvature adjusters 403 will derive corresponding predistortion data according to equations (1)-(6).

Furthermore, in one embodiment of the present invention, the address translators 402 have a function of protecting address validity. That is, if a generated address exceeds a predetermined range (e.g., 0-255), then the address translators 402 will correct it as a valid address closest to it.

Figure 5:
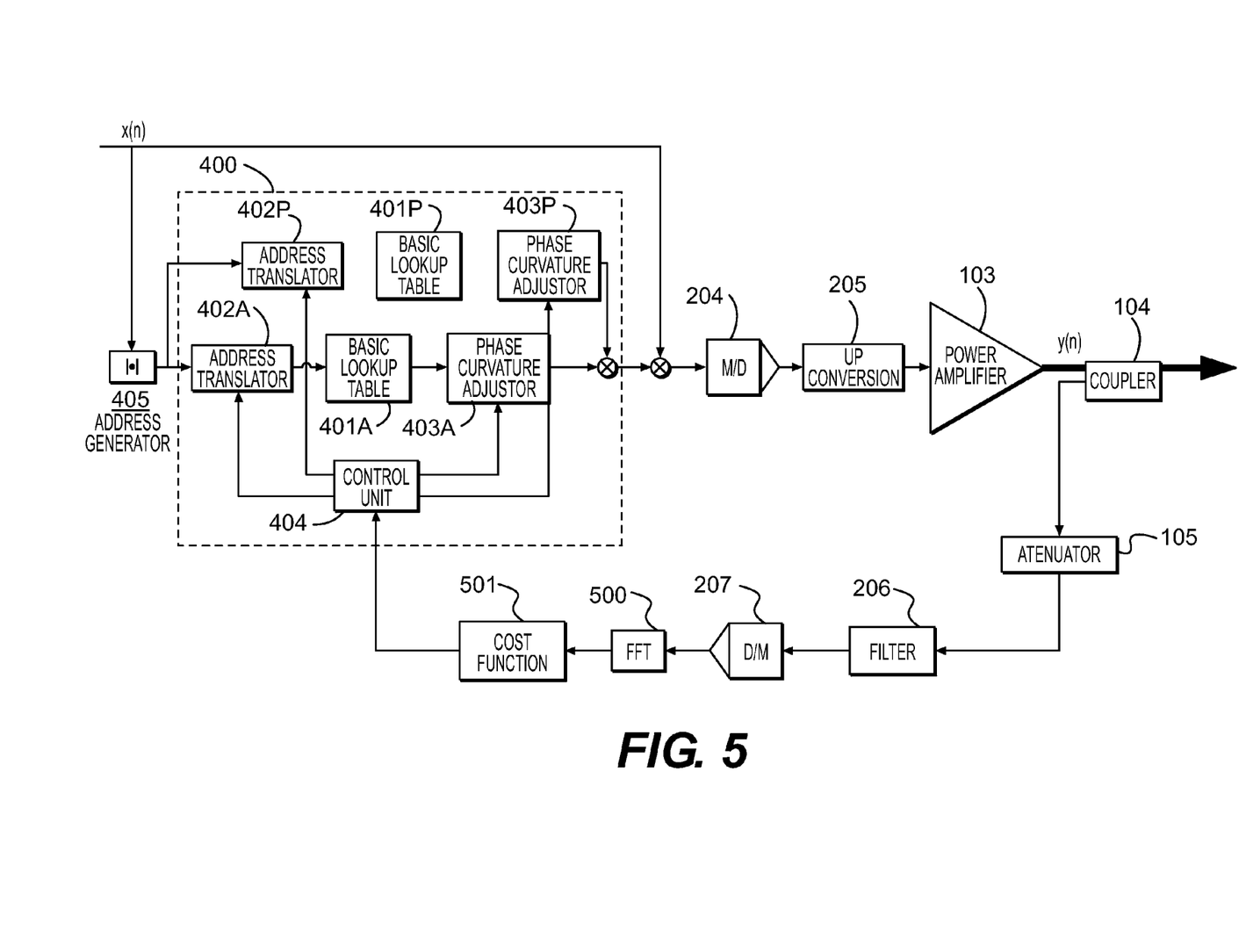
FIG. 5 schematically shows a baseband digital predistortion device according to another embodiment of the present invention.

FIG. 5 schematically shows a baseband predistortion device according to another embodiment of the present invention. The embodiment of FIG. 5 differs from that of FIG. 4 in a cost function generation method, which calculates the cost function in a digital domain.

As shown in FIG. 5, a signal weakened by the attenuator 105 is filtered by a filter 206, and converted into a digital signal by a D/A converter 207. A frequency domain information obtaining unit 500 performs a spectrum estimation of the digital signal to obtain a spectrum of the feedback signal. The frequency domain information obtaining unit 500 can be realized via FFT, DFT, etc. The spectrum is inputted to a cost function calculator 501, which calculates and generates a cost function. Operating in the digital domain □various cost functions can be conveniently obtained, such as a spectrum side lobe power, or a power ratio between the main and side lobes.

To be noted, if the feedback is weak, the attenuator 105 is omissible.

Figure 6:
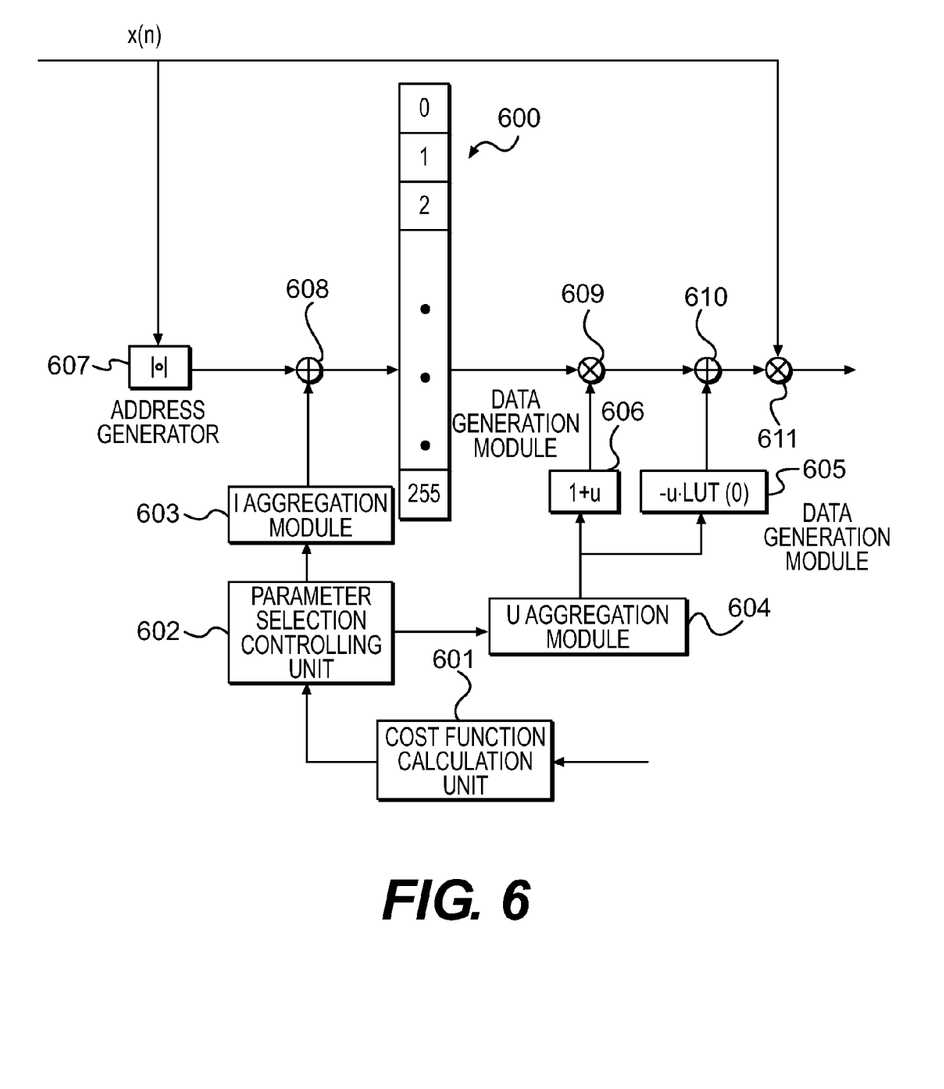
FIG. 6 detailedly shows an implementation of amplitude predistortion device according to one embodiment of the present invention.

FIG. 6 detailedly shows an implementation of a related device for amplitude compensation (amplitude predistortion device) according to one embodiment of the present invention.

As shown in FIG. 6, a cost function from a cost function calculating unit 601 (corresponding to the cost function generation module 407 in FIG. 4 and the cost function calculator 501 in FIG. 5) is inputted to a parameter selection controlling unit 602, which sends a control signal to select proper i and u parameters from a parameter I aggregation module 603 and a parameter U aggregation module 604. The parameter selection controlling unit 602, the parameter I aggregation module 603 and the parameter U aggregation module 604 are corresponding to the control unit 404 in FIGS. 4-5.

Here parameter i is directly sent to an adder 608 (corresponding to the address translator 402A) for being added by an address generated by an address generator 607 (corresponding to the address generator 405), so as to generate a new address signal. Based on the signal, a basic lookup table searching section 600 (corresponding to the basic lookup table searching section 401A) searches the basic lookup table to read and output data.

Parameter u is respectively sent to data generation modules 605 and 606, and then to a multiplier 609 and an adder 610, so that they can operate according to equation (5) and data signal from the basic lookup table searching section 600, and finally obtain predistortion data.

In details, the data generation module 606 calculates 1□u, wherein u is selected by the parameter selection controlling unit 602 from the parameter U aggregation module 604. The calculation result of the data generation module 606 is outputted to a multiplier 609, and multiplied by an output of the basic lookup table searching section 600. On the other hand, the data generation module 605 calculates a product of -u and LUT (0) (herein LUT (0) is corresponding to the first data in the basic LUT), and adder 610 adds the output of the data generation module 605 and the output of the multiplier 609 to obtain amplitude predistortion data. Finally, the multiplier 611 multiplies the predistortion data with the initial signal to obtain a final amplitude predistortion signal. Here the data generation modules 605 and 606, the multiplier 609, and the adder 610 are together corresponding to the curvature adjuster 403A in FIGS. 4-5.

The implementation of related device for phase compensation (phase predistortion device) is similar to that of the related device for amplitude compensation. As different equations are used, the adopted hardware may be slightly different. To be noted, the phase predistortion device does not need any other multiplier when the amplitude predistortion device has the multiplier 611, and the output of the phase predistortion device would be inputted to the multiplier 611. A person skilled in the art can completely implement the related device for phase compensation, based on the implementation of the related device for amplitude compensation, and herein is not described anymore.

To be noted, the above embodiments are just examplary, and other devices can be conceived to implement respective components of the predistortion unit as shown in FIGS. 4-5 of the present invention.

Figure 7:
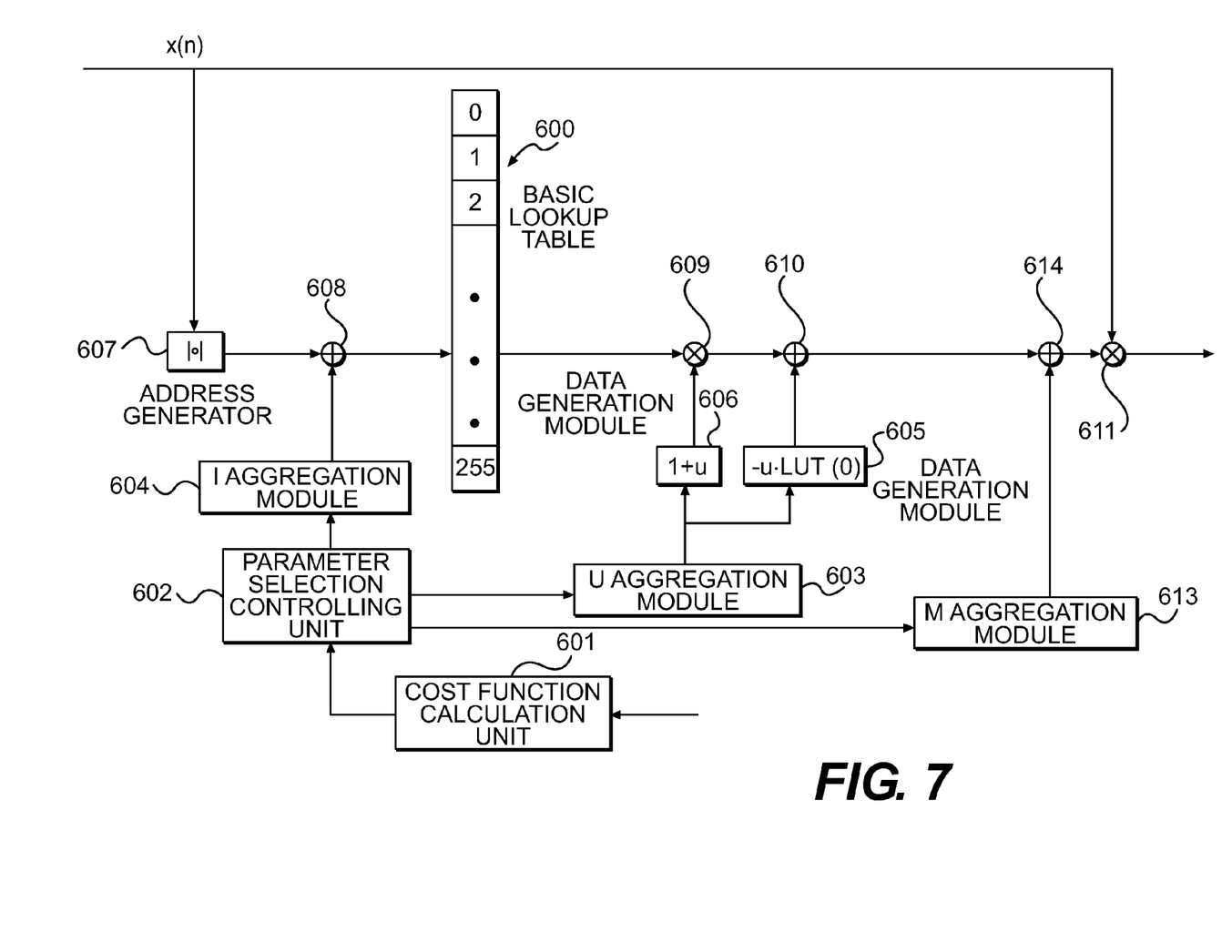
FIG. 7 detailedly shows an implementation of an amplitude predistortion device according to another embodiment of the present invention.

FIG. 7 detailedly shows an implementation of an amplitude predistortion device according to another embodiment of the invention.

FIG. 7 is similar to FIG. 6, and longitudinal translating operations are considered, thus modules such as a parameter M aggregation module 613 are added. Here the parameter selection controlling unit 602 adds a branch of control signal for controlling the parameter M aggregation module 613 to output a parameter m, which is added by a signal processed by parameters i and u in an adder 614 to obtain new predistortion data. With amplitude address translator and amplitude curvature adjustor in FIG. 7, amplitude address translator and amplitude curvature adjustor in equations (18)-(19) can be implemented, wherein the adder 614 and the parameter M aggregation module 613 constitute a longitudinal translating unit.

The location of longitudinal translating operation is flexible, and the operation can also be performed after a transversal translating operation and before a curvature adjustment.

Figure 8:
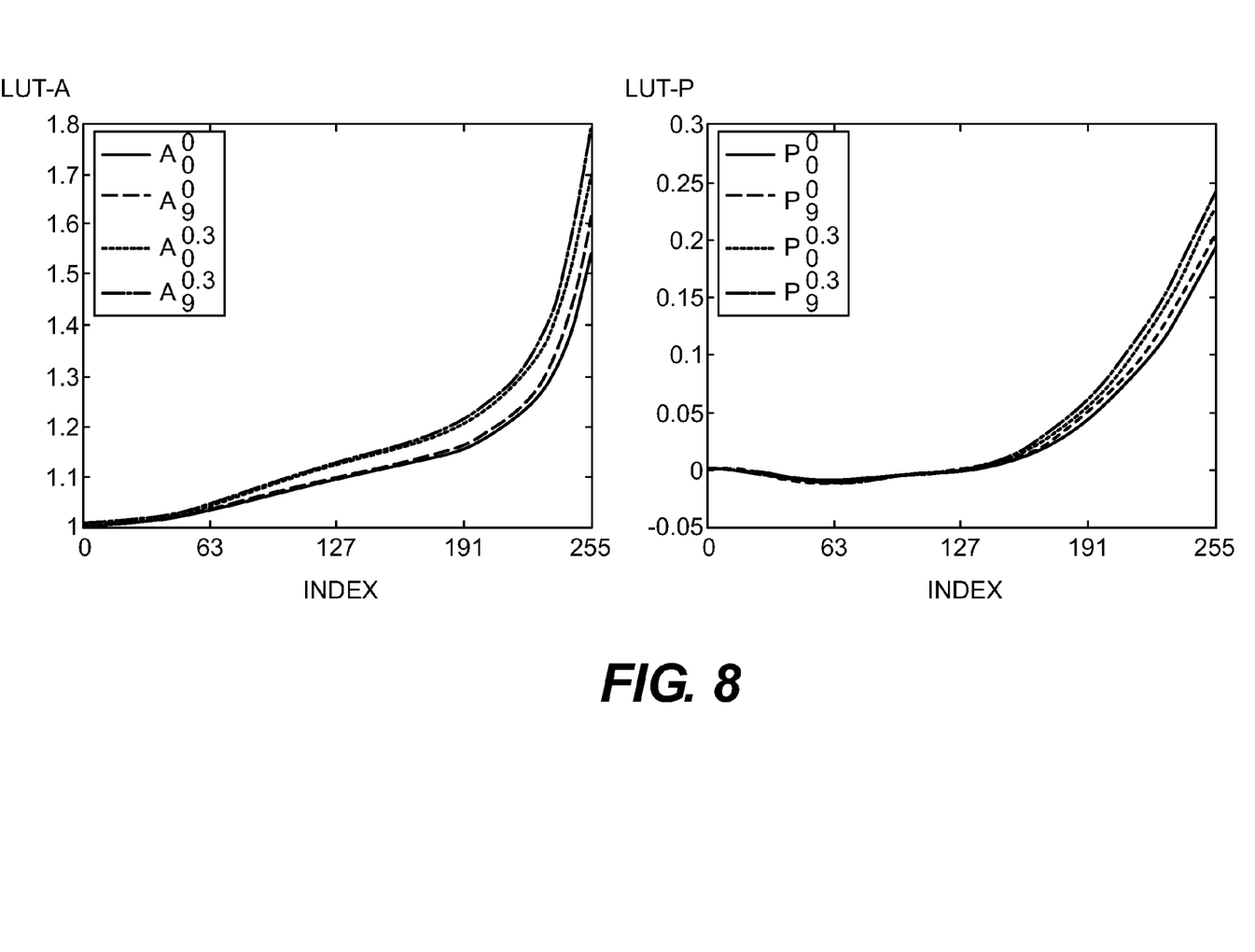
FIG. 8 shows the content of a basic LUT and derived LUT in graphics.

FIG. 8 shows a basic LUT and derived LUT in graphics.

In FIG. 8, the abscissa represents a lookup table address, and the ordinate represents a content at the address, wherein 1 to 255 are valid addresses. This is just examplary, and other ranges such as 0 to 63 and 0 to 127 are also allowable.

As shown in FIG. 8, different initial predistortion data $A_i^u$, $P_j^v$ can be derived by adjusting i, j, u and v, just as described in equations (3)-(6), wherein i and j describe the lookup address translation, while u and v describe the output data correction; $A_0^0$ and $P_0^0$ are basic initial predistortion data.

Figure 9:
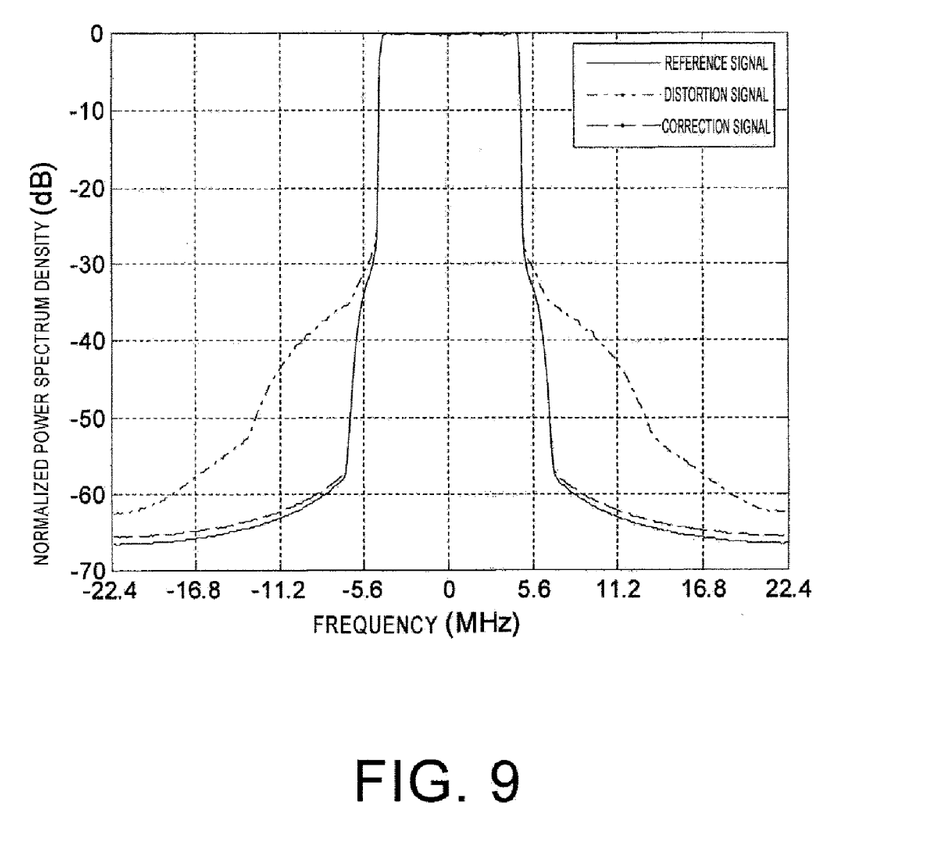
FIG. 9 shows a spectrum correction effect with the method and device of the present invention.

FIG. 9 shows spectrum correction effect achieved by using the method and device of the present invention.

In the figure, the solid line describes a source signal spectrum, the dash-dot line describes a spectrum of a signal directly outputted from a power amplifier, and the broken line describes a spectrum obtained via correction. It can be seen from the figure that the power amplifier can be linearized by adjusting the derived parameters (i, j, u and v) to generate proper predistortion data.

The selection of derived parameters (i, j, u and v) can adopt the concept of selection type scalar method: storing several groups of derived parameters in advance, calculating cost functions (e.g., side lobe height) under different parameters, and then selecting the group corresponding to the minimum cost function to perform a predistortion.

In addition, according to the concept of update type scalar method, the derived parameters can be updated on the spot.

$$i_{k+1} = i_k + \gamma_i e_k \quad (20)$$

$$j_{k+1} = j_k + \gamma_j e_k \quad (21)$$

$$u_{k+1} = u_k + \gamma_u e_k \quad (22)$$

$$v_{k+1} = v_k + \gamma_v e_k \quad (23)$$

wherein k represents the step, $\gamma_i$, $\gamma_j$, $\gamma_u$ and $\gamma_v$ are step lengths of the parameters for updating, $e_k$ is a value obtained when the cost function iterates at the k-th step.

Figure 10:
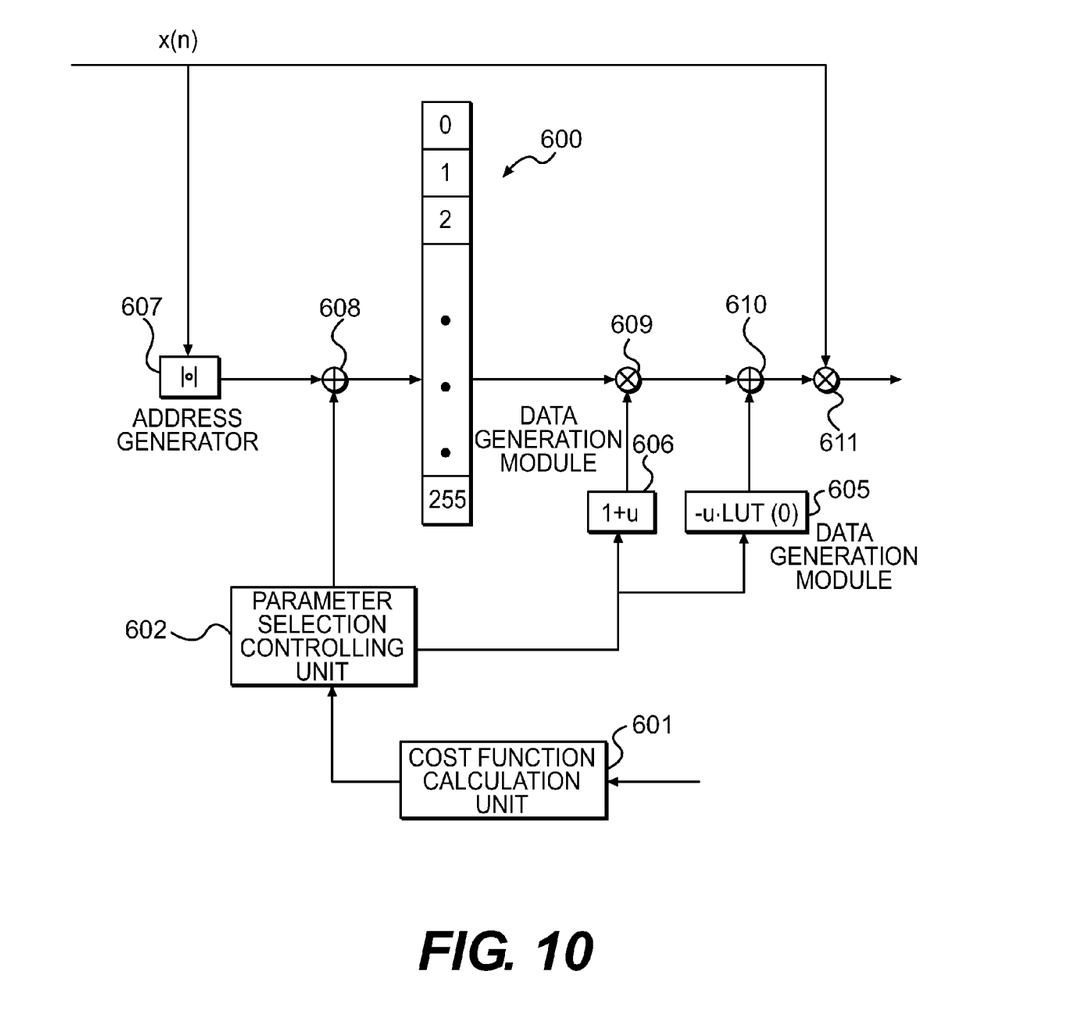
FIGS. 10 and 11 show a phase predistortion device according to another embodiment of the present invention.
Figure 11:
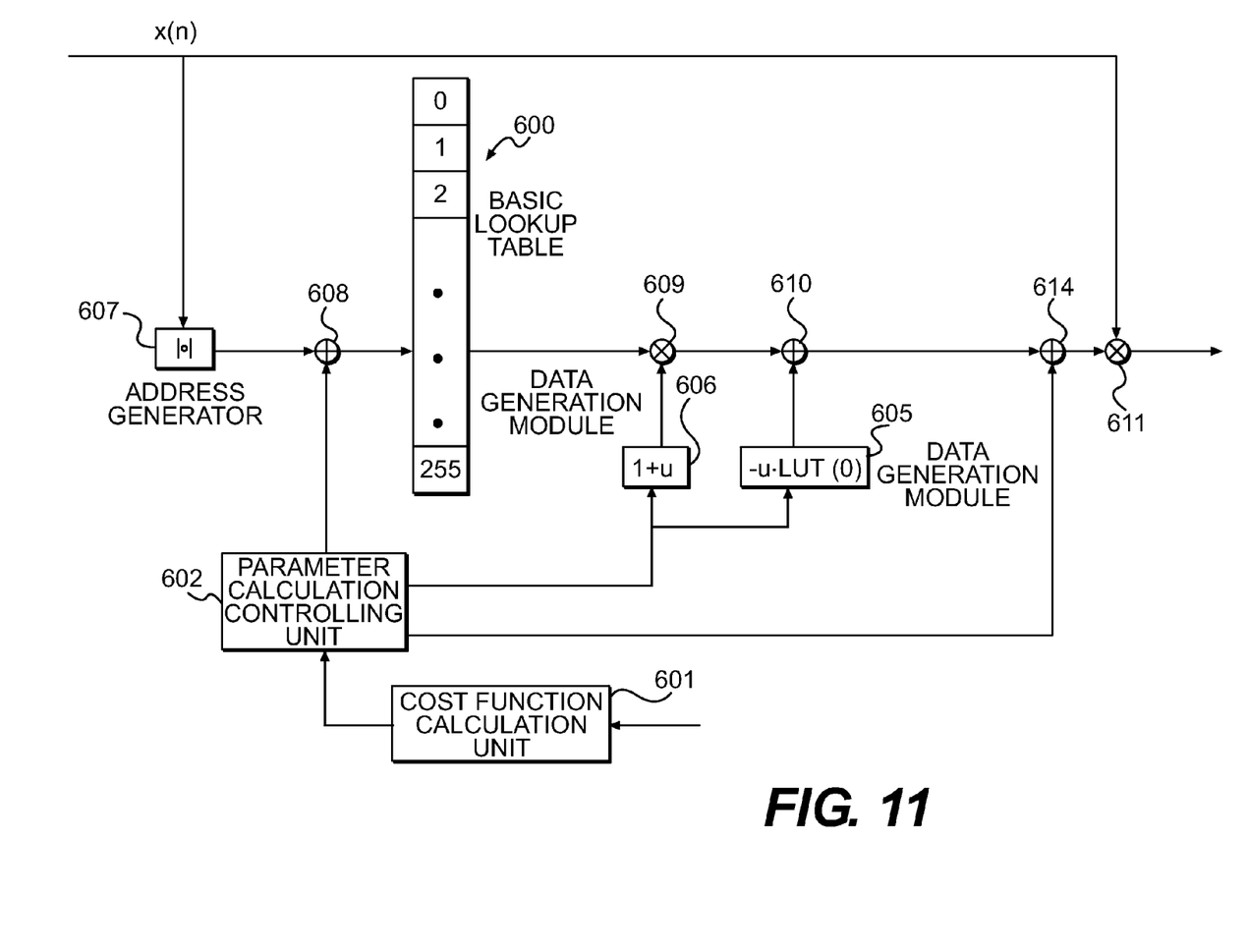

FIGS. 10 and 11 show a phase predistortion device according to another embodiment of the present invention, respectively.

The phase predistortion device in FIGS. 10-11 cancels the I aggregation module 603, U aggregation module 604 and M aggregation module 613 in comparison with the structure in FIGS. 6-7. But at that time, the parameter calculation controlling unit 602 will calculate proper parameters based on the above equations. Under such condition, the load will increase in comparison with that in FIGS. 6-7.

Figure 12:
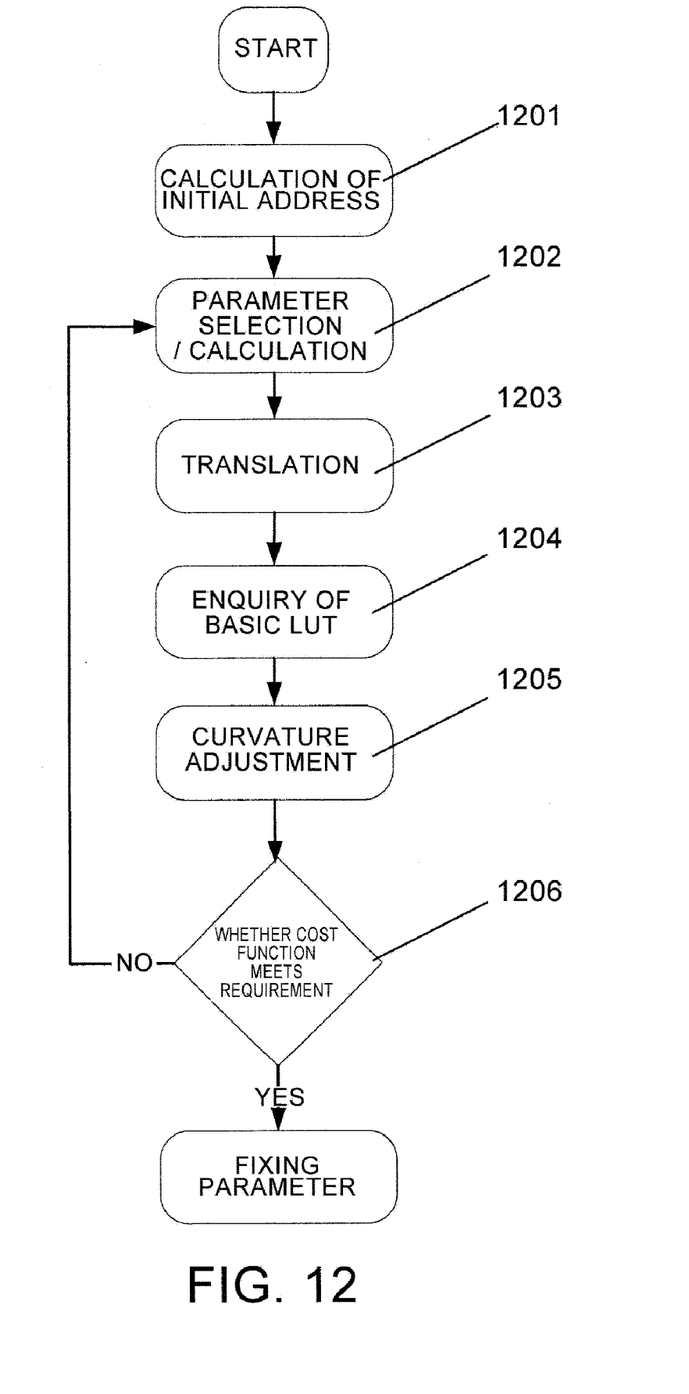
FIG. 12 shows a flow chart of baseband predistortion method according to one embodiment of the present invention.

FIG. 12 shows a flow chart of a baseband predistortion method according to one embodiment of the present invention.

As shown in FIG. 12, firstly in step 1201, calculating a module value of an input signal; secondly in step 1202, determining corresponding parameters in accordance with scalar quantity information of feedback signal, i.e., determining a phase translation amount j, an amplitude translation amount i, a phase curvature adjustment amount v, and an amplitude curvature adjustment amount u.

In step 1203, performing translating operations. In details, changing the module value calculated in the module value calculation step 1201 based on the phase translation amount j determined in the parameter determination step 1202; changing the module value calculated in the module value calculation step 1201 based on the amplitude translation amount i determined in the parameter determination step 1202. Next, in step 1204, searching the basic tables. In details, searching a phase basic lookup table based on the module value translated in the step 1203□phase translation step□, and determining the corresponding phase output of the phase basic lookup table; and searching an amplitude basic lookup table based on the module value translated in the step 1203□amplitude translation step□, and determining the corresponding amplitude output of the amplitude basic lookup table.

Finally, adjusting curvatures in step 1205. Adjusting the phrase output determined in the step 1204□phase basic lookup table searching step□, based on the phase curvature adjustment amount v determined in the parameter determination step 1202; and adjusting the amplitude output determined in the step 1204 (amplitude basic lookup table searching step), based on the amplitude curvature adjustment amount u determined in the parameter determination step 1202.

Next, judging whether the cost function meets the requirement in step 1206. If the requirement is met, then fixing the selected parameters. If the cost function does not meet the requirement, then returning to step 1202 to again perform the parameter selection/calculation and the subsequent steps.

In an optional embodiment, the baseband predistortion method further comprises a longitudinal translation step.

To be noted, the scope of the invention also includes computer program and computer-readable record medium recording the program, which are used for executing the above baseband predistortion method. The record medium may be computer-readable floppy disk and hard disk, semiconductor memory, CD-ROM, DVD, MO and other mediums.

Although the invention is only illustrated with preferred embodiments, based on the contents disclosed herein, a person skilled in the art can easily perform various changes and modifications without departing from the scope of the invention defined by the accompanied claims. The descriptions of the above embodiments are just exemplary, and do not limit the invention defined by the claims and their equivalents.

What is claimed is:

1. A baseband predistorter, comprising:
   an address generator, for calculating, in accordance with an inputted signal, an address of a phase basic lookup table and an address of an amplitude basic lookup table;
   a parameter determining unit, for determining, in accordance with scalar quantity information of a feedback signal, a phase translational amount (j), an amplitude translational amount (i), a phase curvature adjustment amount (v) and an amplitude curvature adjustment amount (u);
   a phase translating unit, for changing the address calculated by the address generator, in accordance with the phase translational amount (j) determined by the parameter determining unit;
   an amplitude translating unit, for changing the address calculated by the address generator, in accordance with the amplitude translational amount (i) determined by the parameter determining unit;
   a phase basic lookup table searching section, for searching the phase basic lookup table in accordance with the address changed by the phase translating unit to determine a corresponding phase output of the phase basic lookup table;
   an amplitude basic lookup table searching section, for searching the amplitude basic lookup table in accordance with the address changed by the amplitude translating unit to determine a corresponding amplitude output of the amplitude basic lookup table;
   a phase curvature adjusting section, for adjusting the phase output determined by the phase basic lookup table searching section, in accordance with the phase curvature adjustment amount (v) determined by the parameter determining unit; and
   an amplitude curvature adjusting section, for adjusting the amplitude output determined by the amplitude basic lookup table searching section, in accordance with the amplitude curvature adjustment amount (u) determined by the parameter determining unit.

2. The baseband predistorter according to claim 1, wherein the parameter determining unit comprises a parameter selection controlling unit for selecting, in accordance with the scalar quantity information of the feedback signal, suitable phase translational amount (j), amplitude translational amount (i), phase curvature adjustment amount (v) and amplitude curvature adjustment amount (u) from corresponding databases.

3. The baseband predistorter according to claim 1, wherein the parameter determining unit comprises a parameter calculating unit for calculating, in accordance with the scalar quantity information of the feedback signal, suitable phase translational amount (j), amplitude translational amount (i), phase curvature adjustment amount (v) and amplitude curvature adjustment amount (u).

4. The baseband predistorter according to claim 1, wherein the phase translating unit and the amplitude translating unit are adders for respectively adding the phase translational amount (j) and the amplitude translational amount (i) determined by the parameter determining unit to the address calculated by the address generator.

5. The baseband predistorter according to claim 1, wherein the phase curvature adjusting section and the amplitude curvature adjusting section each comprises a first parameter calculating unit, a second parameter calculating unit, a multiplier and an adder, wherein:
   the first parameter calculating unit calculates a first parameter (1+u or 1+v);
   the second parameter calculating unit calculates a second parameter (−uLUT(0) or −vLUT(0));
   the multiplier multiplies the output of the amplitude basic lookup table searching section or the output of the phase basic lookup table searching section with the first parameter; and
   the adder adds the multiplication result of the multiplier to the second parameter.

6. The baseband predistorter according to claim 1, further comprising a longitudinal direction translating unit; wherein
   the parameter determining unit determines a longitudinal direction translational amount (m) in accordance with the scalar quantity information of the feedback signal, and the longitudinal direction translating unit performs longitudinal direction translation, in accordance with the longitudinal direction translational amount (m) determined by the parameter determining unit, on the outputs of the phase curvature adjusting section and the amplitude curvature adjusting section, or on the signals translated by the amplitude translating unit and the phase translating unit.

7. An amplifier apparatus, comprising:
   the baseband predistorter according to claim 1;
   a multiplier, for multiplying a predistortion signal outputted by the baseband predistorter with an inputted signal;
   a digital-to-analog converter, for converting a digital signal outputted by the multiplier into an analog signal;
   an up converter, for performing up conversion on the output of the digital-to-analog converter;
   an amplifying unit, for amplifying an output signal of the up converter; and
   a feedback branch, for feeding back a portion of the output of the amplifying unit, i.e. a feedback signal, and for obtaining scalar quantity information of the feedback signal.

8. The amplifier apparatus according to claim 7, wherein the feedback branch comprises:
   a filter, for filtering the feedback signal to obtain a distorted portion of the feedback signal; and
   a cost function obtaining section, for determining the scalar quantity information of the feedback signal in accordance with the distorted portion obtained by the filter.

9. The amplifier apparatus according to claim 7, wherein the feedback branch comprises:
   a down converter, for performing down conversion on the feedback signal;
   an analog-to-digital converting unit, for performing analog-to-digital conversion on the signal having been performed with the down conversion by the down converter;
   a frequency domain information obtaining unit, for obtaining frequency domain information of the signal having been analog-to-digital converted; and
   a cost function obtaining section, for determining the scalar quantity information of the feedback signal in accordance with the obtained frequency domain information.

10. A baseband predistorting method, comprising:
    calculating, in accordance with an inputted signal, an address of a basic amplitude lookup table and an address of a basic phase lookup table;
    determining, in accordance with scalar quantity information of a feedback signal, a phase translational amount (j), an amplitude translational amount (i), a phase curvature adjustment amount (v) and an amplitude curvature adjustment amount (u);

changing the calculated address of the basic phase lookup table, in accordance with the phase translational amount (j);

changing the calculated address of the basic amplitude lookup table, in accordance with the amplitude translational amount (i);

searching the phase basic lookup table in accordance with the address changed in accordance with the phase translational amount (j) to determine a corresponding phase output of the phase basic lookup table;

searching the amplitude basic lookup table in accordance with the address changed in accordance with the amplitude translational amount (i) to determine a corresponding amplitude output of the amplitude basic lookup table;

adjusting the phase output in accordance with the phase curvature adjustment amount (v); and adjusting the amplitude output in accordance with the amplitude curvature adjustment amount (u).

* * * * *